(12) United States Patent
Forbes

(10) Patent No.: US 7,112,494 B2
(45) Date of Patent: Sep. 26, 2006

(54) WRITE ONCE READ ONLY MEMORY EMPLOYING CHARGE TRAPPING IN INSULATORS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/930,514

(22) Filed: Aug. 31, 2004

(65) Prior Publication Data
US 2005/0026375 A1 Feb. 3, 2005

Related U.S. Application Data

(62) Division of application No. 10/739,767, filed on Dec. 18, 2003, which is a division of application No. 10/177,077, filed on Jun. 21, 2002, now Pat. No. 6,804,136.

(51) Int. Cl.
*H01L 21/336* (2006.01)
(52) U.S. Cl. .................. 438/287; 438/288
(58) Field of Classification Search ............ 438/3, 438/216, 261, 287, 954
See application file for complete search history.

(56) References Cited

U.S. PATENT DOCUMENTS

| | | | |
|---|---|---|---|
| 3,665,423 A | 5/1972 | Nakamuma et al. | 340/173 R |
| 3,877,054 A | 4/1975 | Boulin et al. | 357/23 |
| 3,964,085 A | 6/1976 | Kahng et al. | 428/428 |
| 4,152,627 A | 5/1979 | Priel et al. | 315/227 |
| 4,215,156 A | 7/1980 | Dalal et al. | 427/84 |
| 4,217,601 A | 8/1980 | DeKeersmaecker et al. | 357/54 |
| 4,507,673 A | 3/1985 | Aoyama et al. | 357/23 R |
| 4,661,833 A | 4/1987 | Mizutani | 365/185.01 |
| 4,888,733 A | 12/1989 | Mobley | 365/145 |
| 4,939,559 A | 7/1990 | DiMaria et al. | 257/38 |
| 5,021,999 A | 6/1991 | Kohda et al. | 365/168 |
| 5,027,171 A | 6/1991 | Reedy et al. | 357/23.5 |
| 5,042,011 A | 8/1991 | Casper et al. | 365/205 |
| 5,111,430 A | 5/1992 | Morie | 365/185 |
| 5,253,196 A | 10/1993 | Shimabukuro | 365/45 |
| 5,280,205 A | 1/1994 | Green et al. | 307/530 |

(Continued)

FOREIGN PATENT DOCUMENTS

JP 03-222367 10/1991

(Continued)

OTHER PUBLICATIONS

Aarik, Jaan , et al., "Phase transformations in hafnium dioxide thin films grown by atomic layer doposition at high temperatures", *Applied Surface Science*, 173(1-2), (Mar. 2001),15-21.

(Continued)

*Primary Examiner*—Chandra Chaudhari
(74) *Attorney, Agent, or Firm*—Schwegman, Lundberg, Woessner & Kluth, P.A.

(57) ABSTRACT

Structures and methods for write once read only memory employing charge trapping in insulators are provided. The write once read only memory cell includes a metal oxide semiconductor field effect transistor having a first source/drain region, a second source/drain region, a channel region between the first and the second source/drain regions, and a gate separated from the channel region by a gate insulator. A plug couples the first source/drain region to an array plate. A bitline is coupled to the second source/drain region. The MOSFET can be programmed by operation in a reverse direction trapping charge in the gate insulator adjacent to the first source/drain region such that the programmed MOSFET operates at reduced drain source current when read in a forward direction.

30 Claims, 6 Drawing Sheets

U.S. PATENT DOCUMENTS

| | | | |
|---|---|---|---|
| 5,293,560 A | 3/1994 | Harari | 365/185 |
| 5,298,447 A | 3/1994 | Hong | 437/43 |
| 5,317,535 A | 5/1994 | Talreja et al. | 365/185 |
| 5,388,069 A | 2/1995 | Kokubo | 365/185 |
| 5,399,516 A | 3/1995 | Bergendahl et al. | 437/43 |
| 5,409,859 A | 4/1995 | Glass et al. | |
| 5,410,504 A | 4/1995 | Ward | 365/149 |
| 5,424,993 A | 6/1995 | Lee et al. | 365/218 |
| 5,430,670 A | 7/1995 | Rosenthal | 365/45 |
| 5,434,815 A | 7/1995 | Smarandoiu et al. | 365/189.01 |
| 5,438,544 A | 8/1995 | Makino | 365/185 |
| 5,449,941 A | 9/1995 | Yamazaki et al. | 257/411 |
| 5,457,649 A | 10/1995 | Eichman et al. | 365/174 |
| 5,467,306 A | 11/1995 | Kaya et al. | 365/185.2 |
| 5,477,485 A | 12/1995 | Bergemont et al. | 365/185.24 |
| 5,485,422 A | 1/1996 | Bauer et al. | 365/168 |
| 5,493,140 A | 2/1996 | Iguchi | 257/316 |
| 5,508,543 A | 4/1996 | Hartstein et al. | 257/314 |
| 5,530,581 A | 6/1996 | Cogan | 359/265 |
| 5,530,668 A | 6/1996 | Chern et al. | 365/145 |
| 5,539,279 A | 7/1996 | Takeuchi et al. | 365/145 |
| 5,541,871 A | 7/1996 | Nishimura et al. | 365/145 |
| 5,541,872 A | 7/1996 | Lowrey et al. | 365/145 |
| 5,550,770 A | 8/1996 | Kuroda | 365/145 |
| 5,572,459 A | 11/1996 | Wilson et al. | 365/145 |
| 5,600,587 A | 2/1997 | Koike | 365/145 |
| 5,602,777 A | 2/1997 | Nawaki et al. | |
| 5,627,781 A | 5/1997 | Hayashi et al. | 365/185.2 |
| 5,670,790 A | 9/1997 | Katoh et al. | 257/14 |
| 5,714,766 A | 2/1998 | Chen et al. | 257/20 |
| 5,740,104 A | 4/1998 | Forbes | 365/185.03 |
| 5,754,477 A | 5/1998 | Forbes | 365/185.33 |
| 5,768,192 A | 6/1998 | Eitan | 365/185.24 |
| 5,801,401 A | 9/1998 | Forbes | 257/77 |
| 5,822,256 A | 10/1998 | Bauer et al. | 365/200 |
| 5,828,605 A | 10/1998 | Peng et al. | 365/185.29 |
| 5,852,306 A | 12/1998 | Forbes | 257/315 |
| 5,856,688 A | 1/1999 | Lee et al. | 257/295 |
| 5,886,368 A | 3/1999 | Forbes et al. | 257/77 |
| 5,912,488 A | 6/1999 | Kim et al. | 257/316 |
| 5,936,274 A | 8/1999 | Forbes et al. | 257/315 |
| 5,943,262 A | 8/1999 | Choi | 365/185.17 |
| 5,959,896 A | 9/1999 | Forbes | 365/185.33 |
| 5,973,356 A | 10/1999 | Noble et al. | 257/319 |
| 5,989,958 A | 11/1999 | Forbes | 438/257 |
| 5,991,225 A | 11/1999 | Forbes et al. | 365/230.06 |
| 6,005,790 A | 12/1999 | Chan et al. | |
| 6,020,024 A | 2/2000 | Maiti et al. | 427/248.1 |
| 6,031,263 A | 2/2000 | Forbes et al. | 257/315 |
| 6,034,882 A | 3/2000 | Johnson et al. | 365/103 |
| 6,049,479 A | 4/2000 | Thurgate et al. | 365/185.18 |
| 6,072,209 A | 6/2000 | Noble et al. | 257/296 |
| 6,115,281 A | 9/2000 | Aggarwal et al. | 365/145 |
| 6,122,201 A | 9/2000 | Lee et al. | 365/185.29 |
| 6,124,729 A | 9/2000 | Noble et al. | 326/41 |
| 6,125,062 A | 9/2000 | Ahn et al. | 365/198.07 |
| 6,140,181 A | 10/2000 | Forbes et al. | 438/257 |
| 6,141,237 A | 10/2000 | Eliason et al. | 365/145 |
| 6,141,238 A | 10/2000 | Forbes et al. | 365/145 |
| 6,141,260 A | 10/2000 | Ahn et al. | 365/189.07 |
| 6,143,636 A | 11/2000 | Forbes et al. | 438/587 |
| 6,150,687 A | 11/2000 | Noble et al. | 257/302 |
| 6,153,468 A | 11/2000 | Forbes et al. | 438/257 |
| 6,160,739 A | 12/2000 | Wong | |
| 6,166,401 A | 12/2000 | Forbes | 257/77 |
| 6,171,900 B1 | 1/2001 | Sun | 438/240 |
| 6,185,122 B1 | 2/2001 | Johnson et al. | 365/103 |
| 6,212,103 B1 | 4/2001 | Ahrens et al. | 365/185.29 |
| 6,222,768 B1 | 4/2001 | Hollmer et al. | |
| 6,232,643 B1 | 5/2001 | Forbes et al. | 257/405 |
| 6,238,976 B1 | 5/2001 | Noble et al. | 438/259 |
| 6,243,300 B1 | 6/2001 | Sunkavalli | 365/185.29 |
| 6,246,606 B1 | 6/2001 | Forbes et al. | 365/185.03 |
| 6,249,020 B1 | 6/2001 | Forbes et al. | 257/315 |
| 6,252,793 B1 | 6/2001 | Allen et al. | 365/145 |
| 6,269,023 B1 | 7/2001 | Derhacobian et al. | 365/185.24 |
| 6,294,813 B1 | 9/2001 | Forbes et al. | 257/321 |
| 6,297,539 B1 | 10/2001 | Ma et al. | 257/410 |
| 6,303,481 B1 | 10/2001 | Park | 438/591 |
| 6,313,518 B1 | 11/2001 | Ahn et al. | 257/632 |
| 6,320,784 B1 | 11/2001 | Muralidhar et al. | |
| 6,320,786 B1 | 11/2001 | Chang et al. | |
| 6,337,805 B1 | 1/2002 | Forbes et al. | 365/145 |
| 6,351,411 B1 | 2/2002 | Forbes et al. | 365/182 |
| 6,353,554 B1 | 3/2002 | Banks | |
| 6,407,435 B1 | 6/2002 | Ma et al. | 257/411 |
| 6,429,063 B1 | 8/2002 | Eitan | |
| 6,438,031 B1 | 8/2002 | Fastow | 365/185.18 |
| 6,445,030 B1 | 9/2002 | Wu et al. | 257/315 |
| 6,449,188 B1 | 9/2002 | Fastow | 365/185.18 |
| 6,456,531 B1 | 9/2002 | Wang et al. | 365/185.18 |
| 6,456,536 B1 | 9/2002 | Sobek et al. | 365/185.28 |
| 6,459,618 B1 | 10/2002 | Wang | 365/185.18 |
| 6,465,306 B1 * | 10/2002 | Ramsbey et al. | 438/279 |
| 6,487,121 B1 | 11/2002 | Thurgate et al. | 365/185.18 |
| 6,490,204 B1 | 12/2002 | Bloom et al. | |
| 6,490,205 B1 | 12/2002 | Wang et al. | |
| 6,495,436 B1 | 12/2002 | Ahn et al. | 438/591 |
| 6,498,362 B1 | 12/2002 | Forbes et al. | 257/295 |
| 6,504,755 B1 | 1/2003 | Katayama et al. | 365/185.15 |
| 6,514,828 B1 | 2/2003 | Ahn et al. | 438/297 |
| 6,521,950 B1 | 2/2003 | Shimabukuro et al. | 257/350 |
| 6,521,958 B1 | 2/2003 | Forbes et al. | 257/391 |
| 6,534,420 B1 | 3/2003 | Ahn et al. | 438/768 |
| 6,541,816 B1 | 4/2003 | Ramsbey et al. | |
| 6,545,314 B1 | 4/2003 | Forbes et al. | 257/325 |
| 6,552,387 B1 | 4/2003 | Eitan | 257/324 |
| 6,559,014 B1 | 5/2003 | Jeon | 438/287 |
| 6,566,699 B1 | 5/2003 | Eitan | |
| 6,567,303 B1 | 5/2003 | Hamilton et al. | 365/185.03 |
| 6,567,312 B1 | 5/2003 | Torii et al. | 365/185.28 |
| 6,570,787 B1 | 5/2003 | Wang et al. | 365/185.17 |
| 6,580,118 B1 | 6/2003 | Ludwig et al. | |
| 6,580,124 B1 | 6/2003 | Cleeves et al. | 257/331 |
| 6,586,785 B1 | 7/2003 | Flagan et al. | 257/261 |
| 6,618,290 B1 | 9/2003 | Wang et al. | |
| 6,674,138 B1 | 1/2004 | Halliyal et al. | 257/411 |
| 6,714,455 B1 | 3/2004 | Banks | |
| 6,873,539 B1 | 3/2005 | Fazan et al. | |
| 6,996,009 B1 | 2/2006 | Forbes | |
| 2002/0003252 A1 | 1/2002 | Iyer | 257/315 |
| 2002/0027264 A1 | 3/2002 | Forbes et al. | 257/662 |
| 2002/0036939 A1 | 3/2002 | Tsai et al. | 365/201 |
| 2002/0074565 A1 | 6/2002 | Flagan et al. | 257/200 |
| 2002/0089023 A1 | 7/2002 | Yu et al. | 257/411 |
| 2002/0109158 A1 | 8/2002 | Forbes et al. | 257/224 |
| 2002/0155688 A1 | 10/2002 | Ahn et al. | 438/592 |
| 2002/0155689 A1 | 10/2002 | Ahn et al. | 29/76 |
| 2002/0192974 A1 | 12/2002 | Ahn et al. | 438/722 |
| 2003/0017717 A1 | 1/2003 | Ahn et al. | 438/768 |
| 2003/0235077 A1 | 12/2003 | Forbes | 365/185.05 |
| 2003/0235081 A1 | 12/2003 | Forbes | 365/185.28 |
| 2003/0235085 A1 | 12/2003 | Forbes | 365/189.09 |
| 2004/0063276 A1 | 4/2004 | Yamamoto et al. | 438/241 |
| 2006/0001080 A1 | 1/2006 | Forbes | |
| 2006/0002188 A1 | 1/2006 | Forbes | |
| 2006/0008966 A1 | 1/2006 | Forbes et al. | |

FOREIGN PATENT DOCUMENTS

| | | |
|---|---|---|
| JP | 5090169 | 4/1993 |
| JP | 06-224431 | 8/1994 |
| JP | 06-302828 | 10/1994 |

JP   08-255878   10/1996

OTHER PUBLICATIONS

Abbas, S. A., et al., "N-Channel Igfet Design Limitations Due to Hot Electron Trapping", *Technical Digest, International Electron Devices Meeting,*, Washington, DC,(Dec. 1975),35-38.

Adelmann, C , et al., "Atomic-layer epitaxy of GaN quantum wells and quantum dots on (0001) AlN", *Journal of Applied Physics*, 91(8), (Apr. 15, 2002),5498-5500.

Ahn, Seong-Deok, et al., "Surface Morphology Improvement of Metalorganic Chemical Vapor Deposition Al Films by Layered Deposition of Al and Ultrathin TiN", *Japanese Journal of Applied Physics, Part 1 (Regular Papers, Short Notes & Review Papers)*, 39(6A), (Jun. 2000),3349-3354.

Akasaki, I. , "Effects of AlN Buffer Layer on Crystallographic Structure and on Electrical and Optical Properties of GaN and Ga(1-x)Al(x)N [0< x (< or =) 0.4] Films Grown on Sapphire Substrate by MOVPE", *Journal of Crystal Growth, 98*, (1989),209-219.

Alen, Petra , et al., "Atomic Layer Deposition of Ta(Al)N(C) Thin Films Using Trimethylaluminum as Reducing Agent", *Journal of the Electrochemical Society* , 148(10), (Oct. 2001),G566-G571.

Asari, K , et al., "Multi-mode and multi-level technologies for FeRAM embedded reconfigurable hardware", *Solid-State Circuits Conference, 1999. Digest of Technical Papers. ISSCC. 1999 IEEE International*, (Feb. 15-17, 1999),106-107.

Benjamin, M. , "UV Photoemission Study of Heteroepitaxial AlGaN Films Grown on 6H-SiC", *Applied Surface Science, 104/ 105*, (Sep. 1996),455-460.

Bermudez, V. , "The Growth and Properties of Al and AlN Films on GaN(0001)-(1×1)", *Journal of Applied Physics*, 79(1), (Jan. 1996),110-119.

Britton, J , et al., "Metal-nitride-oxide IC memory retains data for meter reader", *Electronics*, 45(22), (Oct. 23, 1972), 119-23.

Carter, R J., "Electrical Characterization of High-κ Materials Prepared By Atomic Layer CVD", *IWGI*, (2001),94-99.

Chang, C. , "Novel Passivation Dielectrics-The Boron- or Phosphorus-Doped Hydrogenated Amorphous Silicon Carbide Films", *Journal of the Electrochemical Society, 132*, (Feb. 1985),418-422.

Cricchi, J R., et al., "Hardened MNOS/SOS electrically reprogrammable nonvolatile memory", *IEEE Transactions on Nuclear Science*, 24(6), (Dec. 1977),2185-9.

Demichelis, F. , "Influence of Doping on the Structural and Optoelectronic Properties of Amorphous and Microcrystalline Silicon Carbide", *Journal of Applied Physics, 72*, (Aug. 15, 1992), 1327-1333.

Demichelis, F. , "Physical Properties of Undoped and Doped Microcrystalline SiC:H Deposited By PECVD", *Materials Research Society Symposium Proceedings, 219,* Anaheim, CA,(Apr. 30-May 3, 1991),413-418.

Dimaria, D J., "Graded or stepped energy band-gap-insulator MIS structures (GI-MIS or SI-MIS)", *Journal of Applied Physics*, 50(9), (Sep. 1979),5826-5829.

Dipert, B. , et al., "Flash Memory goes Mainstream", *IEE Spectrum*, No. 10, (Oct. 1993),48-50.

Dipert, Brian , "Flash Memory Goes Mainstream", *IEEE Spectrum*, 30(10), (Oct. 1993),48-52.

Eitan, Boaz , "NROM: A Novel Localized Trapping, 2-Bit Nonvolatile Memory Cell", *IEEE Electron Device Letters*, 21(11), (Nov. 2000),543-545.

Elam, J W., "Kinetics of the WF6 and Si2H6 surface reactions during tungsten atomic layer deposition", *Surface Science*, 479(1-3), (May 2001),121-135.

Fauchet, P M., et al., "Optoelectronics and photovoltaic applications of microcrystalline SiC", *Symp. on Materials Issues in Mecrocrystalline Semiconductors*, (1989),291-292.

Ferris-Prabhu, A V., "Amnesia in layered insulator FET memory devices", *1973 International Electron Devices Meeting Technical Digest*, (1973),75-77.

Ferris-Prabhu, A V., "Charge transfer in layered insulators", *Solid-State Electronics*, 16(9), (Sep. 1973), 1086-7.

Ferris-Prabhu, A V., "Tunnelling theories of non-volatile semiconductor memories", *Physica Status Solidi A, 35*(1), (May 16, 1976),243-50.

Fisch, D E., et al., "Analysis of thin film ferroelectric aging", *Proc. IEEE Int. Reliability Physics Symp.*, (1990),237-242.

Forbes, L. , et al., "Field Induced Re-Emission of Electrons Trapped in SiO", *IEEE Transactions on Electron Devices, ED-26* (11), Briefs,(Nov. 1979),1816-1818.

Forsgren, Katarina , "Atomic Layer Deposition of HfO2 using hafnium iodide", *Conference held in Monterey, California*, (May 2001),1 page.

Frohman-Bentchkowsky, D , "An integrated metal-nitride-oxide-silicon (MNOS) memory", *Proceedings of the IEEE*, 57(6), (Jun. 1969),1190-1192.

Guha, S , et al., "Atomic beam deposition of lanthanum-and yttrium-based oxide thin films for gate dielectrics", *Appl. Phys. Lett., 77*, (2000),2710-2712.

Hwang, C G., "Semiconductor Memories for the IT Era", *2002 IEEE International Solid-State Circuits Conference. Digest of Technical Papers IEEE. Part vol. 1*, San Francisco,(2002),24-27.

Hwang, N. , et al., "Tunneling and Thermal Emission of Electrons from a Distribution of Deep Traps in SiO", *IEEE Transactions on Electron Devices*, 40(6), (Jun. 1993),1100-1103.

Kim, Y , et al., "Substrate dependence on the optical properties of Al/sub 2/O/sub 3/ films grown by atomic layer deposition", *Applied Physics Letters*, 71(25, 22), (Dec. 1997),3604-3606.

Klaus, J W., et al., "Atomic layer deposition of tungsten nitride films using sequential surface reactions", *Journal of the Electrochemical Society*, 147(3), (Mar. 2000),1175-81.

Koo, J , "Study on the characteristics of TiAlN thin film deposited by atomic layer deposition method", *Journal of Vacuum Science & Technology A-Vacuum Surfaces & Films*, 19(6), (Nov. 2001),2831-4.

Kukli, K , "Tailoring the dielectric properties of HfO2—Ta2O3 nanolaminates", *Appl. Phys. Lett., 68*, (1996),3737-3739.

Lei, T. , "Epitaxial Growth and Characterization of Zinc-Blende Gallium Nitride on (001) Silicon", *Journal of Applied Physics, 71(10)*, (May 1992),4933-4943.

Leskela, M , et al., "ALD precursor chemistry: Evolution and future challenges", *Journal de Physique IV (Proceedings)*, 9(8), (Sep. 1999),837-852.

Luan, H. , "High Quality Ta2O5 Gate Dielectrics with Tox,eq<10A", *IEDM*, (1999),pp. 141-144.

Lusky, E , et al., "Characterization of Channel Hot Electron Injection by the Subthreshold Slope of NROM Device", *IEEE Electron Device Letters*, 22(11), (Nov. 2001),556-558.

Maayan, E. , et al., "A 512Mb BROM Flash Data Storage: Memory with 8MB/s Data Rate", *ISSCC 2002 / Session 6 / SRAM and Non-Volatile Memories*, (Feb. 2002),4 pages.

Maayan, Eduardo , et al., "A 512Mb NROM Flash Data Storage Memory with 8MB/s Data Rate", *Solid-State Circuits Conference, 2002. Digest of Technical Papers. ISSCC*, (2002),100-101.

Marlid, Bjorn , et al., "Atomic layer deposition of BN thin films", *Thin Solid Films*, 402(1-2), (Jan. 2002),167-171.

Martins, R , "Transport Properties of Doped Silicon Oxycarbide Microcrystalline Films Produced by Spatial Separation Techniques", *Solar Energy Materials and Solar Cells, 41-42*, (1996),493-517.

Martins, R. , "Wide Band Gap Microcrystalline Silicon Thin Films", *Diffusion and Defect Data : Solid State Phenomena, 44-46, Part 1*, Scitec Publications,(1995),299-346.

Min, J. , "Metal-organic atomic-layer deposition of titanium-silicon-nitride films", *Applied Physics Letters*, 75(11), (1999),1521-1523.

Moazzami, R , "Endurance properties of Ferroelectric PZT thin films", *Int. Electron Devices Mtg.*, San Francisco,(1990),417-20.

Moazzami, R , "Ferroelectric PZT thin films for semiconductor memory", *Ph.D Thesis, University of California, Berkeley,* (1991).

Morishita, S , "Atomic-layer chemical-vapor-deposition of SiO/sub 2/ by cyclic exposures of CH/sub 3/OSi(NCO)/sub 3/ and H/sub 2/O/sub 2/", *Japanese Journal of Applied Physics Part 1—Regular Papers Short Notes & Review Papers*, 34(10), (Oct. 1995),5738-42.

Moriwaki, M, "Improved metal gate process by simultaneous gate-oxide nitridation during W/WN/sub x/gate formation", *Japanese Journal of Applied Physics Part 1—Regular Papers Short Notes & Review Papers*, 39(4B), (Apr. 2000),2177-2180.

Nakajima, Anri, "Soft breakdown free atomic-layer-deposited silicon-nitride/SiO/sub 2/ stack gate dielectrics", *International Electron Devices Meeting. Technical Digest*, (2001),6.5.1-4.

Niilisk, A, "Atomic-scale optical monitoring of the initial growth of TiO2 thin films", *Proceedings of the SPIE—The International Society for Optical Engineering*, 4318, (2001),72-77.

Pankove, J., "Photoemission from GaN", *Applied Physics Letters*, 25(1), (Jul. 1, 1974),53-55.

Papadas, C., "Modeling of the Intrinsic Retention Charcteristics of FLOTOX EEPROM Cells Under Elevated Temperature Conditions", *IEEE Transaction on Electron Devices*, 42, (Apr. 1995),678-682.

Park, Jin-Seong, et al., "Plasma-Enhanced Atomic Layer Deposition of Tantalum Nitrides Using Hydrogen Radicals as a Reducing Agent", *Electrochemical & Solid-State Letters*, 4(4), (Apr. 2001),C17-19.

Puurunen, R L., et al., "Growth of aluminum nitride on porous silica by atomic layer chemical vapour deposition", *Applied Surface Science*, 165(2-3), (Sep. 12, 2000),193-202.

Renlund, G. M., "Silicon oxycarbide glasses: Part I. Preparation and chemistry", *J. Mater. Res.*, (Dec., 1991),pp. 2716-2722.

Renlund, G. M., "Silicon oxycarbide glasses: Part II. Structure and properties", *J. Mater. Res.*, vol. 6, No. 12,(Dec., 1991),pp. 2723-2734.

Robertson, J., "Band offsets of wide-band-gap oxides and implications for future electronic devices", *Journal of Vacuum Science & Technology B (Microelectronics and Nanometer Structures)*, 18(3), (May-Jun. 2000),1785-1791.

She, Min, et al., "Modeling and design study of nanocrystal memory devices", *IEEE Device Research Conference*, (2001),139-40.

Shimada, H, et al., "Tantalum nitride metal gate FD-SOI CMOS FETs using low resistivity self-grown bcc-tantalum layer", *IEEE Transactions on Electron Devices*, vol. 48, No. 8, (Aug. 200), 1619-1626.

Sze, S M., "Physics of semiconductor devices", *New York: Wiley*, (1981),504-506.

Wei, L S., et al., "Trapping, emission and generation in MNOS memory devices", *Solid-State Electronics*, 17(6), (Jun. 1974),591-8.

White, M H., et al., "Characterization of thin-oxide MNOS memory transistors", *IEEE Transactions on Electron Devices*, ED-19(12), (Dec. 1972),1280-1288.

White, M H., "Direct tunneling in metal-nitride-oxide-silicon (MNOS) structures", *Programmme of the 31st physical electronics conference*, (1971),1.

Wood, S W., "Ferroelectric memory design", *M.A.Sc. thesis, University of Toronto*, (1992).

Yoder, M, "Wide Bandgap Semiconductor Materials and Devices", *IEEE Transactions on Electron Devices*, 43, (Oct. 1996), 1633-1636.

Zhu, W J., et al., "Current transport in metal/hafnium oxide/silicon structure", *IEEE Electron Device Letters*, 23, (2002),97-99.

\* cited by examiner

WRITE ONCE READ ONLY MEMORY EMPLOYING CHARGE TRAPPING IN INSULATORS

CROSS REFERENCE TO RELATED APPLICATIONS

This application is a Divisional of U.S. application Ser. No. 10/739,767 filed Dec. 18, 2003 which is a Divisional of U.S. application Ser. No. 10/177,077 filed Jun. 21, 2002 now U.S. Pat. No. 6,804,136. These applications are incorporated herein by reference.

This application is related to the following commonly assigned U.S. patent applications: "Ferroelectric Write Once Read Only Memory for Archival Storage," Ser. No. 10/177,082, "Write Once Read Only Memory Employing Floating Gates," Ser. No. 10/177,083, "Nanocrystal Write Once Read Only Memory for Archival Storage," Ser. No. 10/177,214, "Write Once Read Only Memory with Large Work Function Floating Gates," Ser. No. 10/177,213, "Vertical NROM Having a Storage Density of 1 Bit per $1F^2$," Ser. No. 10/177,208, and "Multistate NROM Having a Storage Density Much Greater than 1 Bit per $1F^2$," Ser. No. 10/177,211, each of which disclosure is herein incorporated by reference.

FIELD OF THE INVENTION

The present invention relates generally to semiconductor integrated circuits and, more particularly, to write once read only memory employing charge trapping in insulators.

BACKGROUND OF THE INVENTION

Many electronic products need various amounts of memory to store information, e.g. data. One common type of high speed, low cost memory includes dynamic random access memory (DRAM) comprised of individual DRAM cells arranged in arrays. DRAM cells include an access transistor, e.g a metal oxide semiconducting field effect transistor (MOSFET), coupled to a capacitor cell. With successive generations of DRAM chips, an emphasis continues to be placed on increasing array density and maximizing chip real estate while minimizing the cost of manufacture. It is further desirable to increase array density with little or no modification of the DRAM optimized process flow.

A requirement exists for memory devices which need only be programmed once, as for instance to function as an electronic film in a camera. If the memory arrays have a very high density then they can store a large number of very high resolution images in a digital camera. If the memory is inexpensive then it can for instance replace the light sensitive films which are used to store images in conventional cameras.

Thus, there is a need for improved DRAM technology compatible write once read only memory. It is desirable that such write once read only memory be fabricated on a DRAM chip with little or no modification of the DRAM process flow. It is further desirable that such write once read only memory operate with lower programming voltages than that used by conventional DRAM cells, yet still hold sufficient charge to withstand the effects of parasitic capacitances and noise due to circuit operation.

REFERENCES

L. Forbes, W. P. Noble and E. H. Cloud, entitled "MOSFET Technology for Programmable Address Decode and Correction," U.S. Pat. No. 6,521,950;

L. Forbes, E. Sun, R. Alders and J. Moll, "Field Induced Re-Emission of Electrons Trapped in SiO2," IEEE Trans. Electron Device, vol. ED-26, no. 11, pp. 1816–1818 (November 1979);

S. S. B. Or, N. Hwang, and L. Forbes, "Tunneling and Thermal Emission from a Distribution of Deep Traps in SiO2," IEEE Trans. on Electron Devices, vol. 40, no. 6, pp. 1100–1103 (June 1993);

S. A. Abbas and R. C. Dockerty, "N-Channel IGFET Design Limitations Due to Hot Electron Trapping," IEEE Int. Electron Devices Mtg., Washington D.C., December 1975, pp. 35–38;

B. Eitan et al., "Characterization of Channel Hot Electron Injection by the Subthreshold Slope of NROM Device," IEEE Electron Device Lett., Vol. 22, No. 11, pp. 556–558, (November 2001);

B. Etian et al., "NROM: A Novel Localized Trapping, 2-Bit Nonvolatile Memory Cell," IEEE Electron Device Lett., Vol. 21, No. 11, pp. 543–545, (November 2000);

S. Sze, Physics of Semiconductor Devices, Wiley, N.Y., 1981, pp. 504–506); L. Forbes and J. Geusic, "Memory Using Insulator Traps," U.S. Pat. No. 6,140,181.

SUMMARY OF THE INVENTION

The above mentioned problems for creating DRAM technology compatible write once read only memory cells as well as other problems are addressed by the present invention and will be understood by reading and studying the following specification. This disclosure teaches structures and methods using MOSFET devices as write once read only memory in a DRAM integrated circuit. The structures and methods use the existing process sequence for MOSFET's in DRAM technology.

In particular, an illustrative embodiment of the present invention includes a write once read only memory cell. The write once read only memory cell includes a metal oxide semiconductor field effect transistor (MOSFET). The MOSFET has a first source/drain region, a second source/drain region, a channel region between the first and the second source/drain regions, and a gate separated from the channel region by a gate insulator. A plug is coupled to the first source/drain region. The plug couples the first source/drain region to an array plate. A transmission line is coupled to the second source/drain region. The MOSFET is a programmed MOSFET having a charge trapped in the gate oxide adjacent to the first source/drain region. Accordingly, the channel region has a first voltage threshold region (Vt1) and a second voltage threshold region (Vt2) such that the programmed MOSFET operates at reduced drain source current.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

Figure 1A:
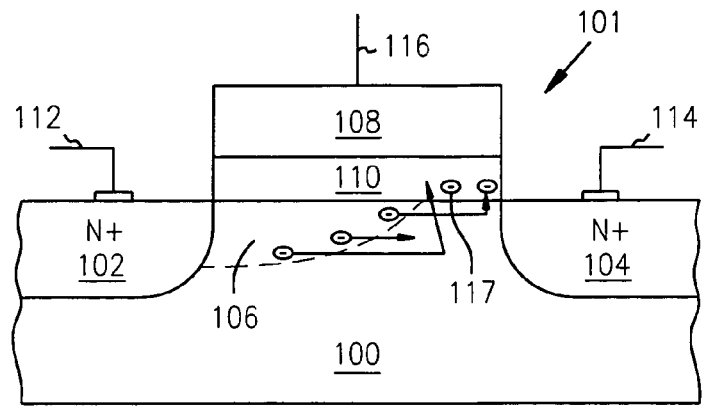
FIG. 1A is a block diagram of a metal oxide semiconductor field effect transistor (MOSFET) in a substrate according to the teachings of the prior art.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

FIG. 1A is useful in illustrating the conventional operation of a MOSFET such as can be used in a DRAM array. FIG. 1A illustrates the normal hot electron injection and degradation of devices operated in the forward direction. As is explained below, since the electrons are trapped near the drain they are not very effective in changing the device characteristics.

FIG. 1A is a block diagram of a metal oxide semiconductor field effect transistor (MOSFET) 101 in a substrate 100. The MOSFET 101 includes a source region 102, a drain region 104, a channel region 106 in the substrate 100 between the source region 102 and the drain region 104. A gate 108 is separated from the channel region 108 by a gate oxide 110. A sourceline 112 is coupled to the source region 102. A bitline 114 is coupled to the drain region 104. A wordline 116 is coupled to the gate 108.

In conventional operation, a drain to source voltage potential (Vds) is set up between the drain region 104 and the source region 102. A voltage potential is then applied to the gate 108 via a wordline 116. Once the voltage potential applied to the gate 108 surpasses the characteristic voltage threshold (Vt) of the MOSFET a channel 106 forms in the substrate 100 between the drain region 104 and the source region 102. Formation of the channel 106 permits conduction between the drain region 104 and the source region 102, and a current signal (Ids) can be detected at the drain region 104.

Figure 1B:
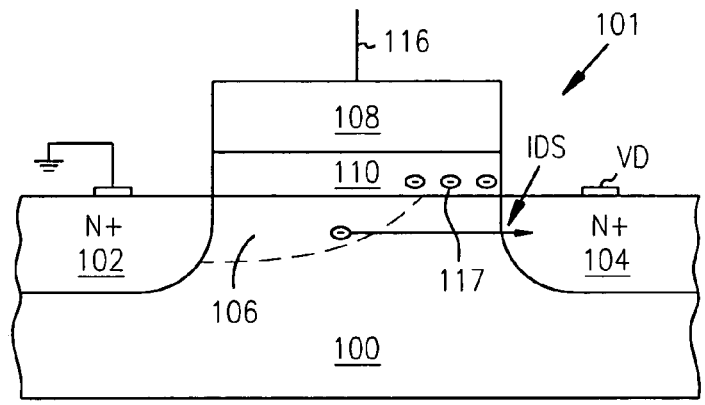
FIG. 1B illustrates the MOSFET of FIG. 1A operated in the forward direction showing some degree of device degradation due to electrons being trapped in the gate oxide near the drain region over gradual use.

In operation of the conventional MOSFET of FIG. 1A, some degree of device degradation does gradually occur for MOSFETs operated in the forward direction by electrons 117 becoming trapped in the gate oxide 110 near the drain region 104. This effect is illustrated in FIG. 1B. However, since the electrons 117 are trapped near the drain region 104 they are not very effective in changing the MOSFET characteristics.

Figure 1C:
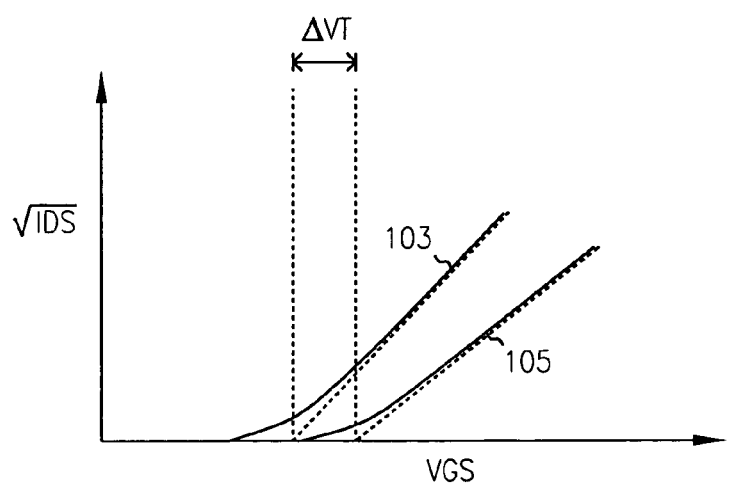
FIG. 1C is a graph showing the square root of the current signal (Ids) taken at the drain region of the conventional MOSFET versus the voltage potential (VGS) established between the gate and the source region.

FIG. 1C illustrates this point. FIG. 1C is a graph showing the square root of the current signal (Ids) taken at the drain region versus the voltage potential (VGS) established between the gate 108 and the source region 102. The change in the slope of the plot of $\sqrt{Ids}$ versus VGS represents the change in the charge carrier mobility in the channel 106.

In FIG. 1C, ΔVT represents the minimal change in the MOSFET's threshold voltage resulting from electrons gradually being trapped in the gate oxide 110 near the drain region 104, under normal operation, due to device degradation. This results in a fixed trapped charge in the gate oxide 110 near the drain region 104. Slope 103 represents the charge carrier mobility in the channel 106 for FIG. 1A having no electrons trapped in the gate oxide 110. Slope 105 represents the charge mobility in the channel 106 for the conventional MOSFET of FIG. 1B having electrons 117 trapped in the gate oxide 110 near the drain region 104. As shown by a comparison of slope 103 and slope 105 in FIG. 1C, the electrons 117 trapped in the gate oxide 110 near the drain region 104 of the conventional MOSFET do not significantly change the charge mobility in the channel 106.

There are two components to the effects of stress and hot electron injection. One component includes a threshold voltage shift due to the trapped electrons and a second component includes mobility degradation due to additional scattering of carrier electrons caused by this trapped charge and additional surface states. When a conventional MOSFET degrades, or is "stressed," over operation in the forward direction, electrons do gradually get injected and become trapped in the gate oxide near the drain. In this portion of the conventional MOSFET there is virtually no channel underneath the gate oxide. Thus the trapped charge modulates the threshold voltage and charge mobility only slightly.

The inventor, along with others, has previously described programmable memory devices and functions based on the reverse stressing of MOSFET's in a conventional CMOS process and technology in order to form programmable address decode and correction in U.S. Pat. No. 6,521,950 entitled, "MOSFET Technology for Programmable Address Decode and Correction." That disclosure, however, did not describe write once read only memory solutions, but rather address decode and correction issues.

According to the teachings of the present invention, normal MOSFETs can be programmed by operation in the reverse direction and utilizing avalanche hot electron injection to trap electrons in the gate oxide of the MOSFET. When the programmed MOSFET is subsequently operated in the forward direction the electrons trapped in the oxide are near the source and cause the channel to have two different threshold voltage regions. The novel programmed MOSFETs of the present invention conduct significantly less current than conventional MOSFETs, particularly at low drain voltages. These electrons will remain trapped in the gate oxide unless negative gate voltages are applied. The electrons will not be removed from the gate oxide when positive or zero gate voltages are applied. Erasure can be accomplished by applying negative gate voltages and/or increasing the temperature with negative gate bias applied to cause the trapped electrons to be re-emitted back into the silicon channel of the MOSFET.

Figure 2A:
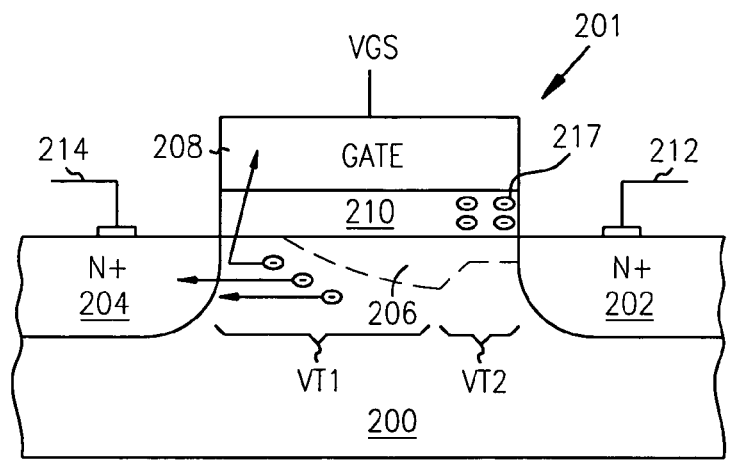
FIG. 2A is a diagram of a programmed MOSFET which can be used as a write once read only memory cell according to the teachings of the present invention.
Figure 2B:
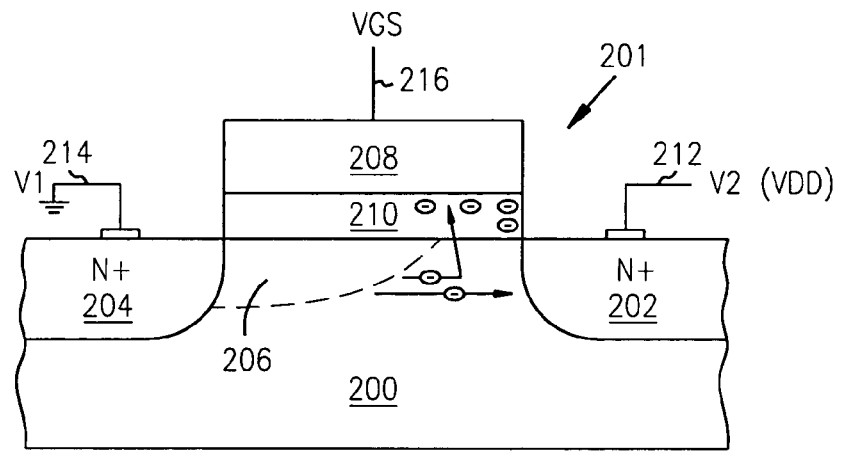
FIG. 2B is a diagram suitable for explaining the method by which the MOSFET of the write once read only memory cell of the present invention can be programmed to achieve the embodiments of the present invention.
Figure 2C:
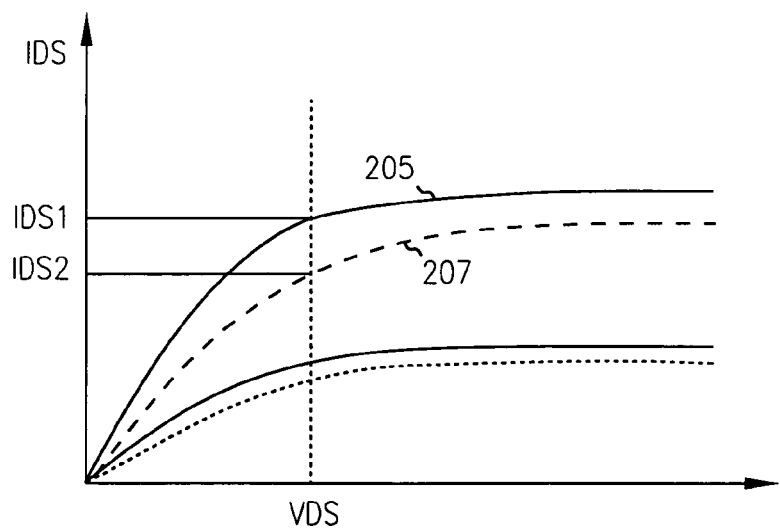
FIG. 2C is a graph plotting the current signal (Ids) detected at the drain region versus a voltage potential, or drain voltage, (VDS) set up between the drain region and the source region (Ids vs. VDS).

FIGS. 2A–2C illustrate are useful in illustrating the present invention in which a much larger change in device characteristics is obtained by programming the device in the reverse direction and subsequently reading the device by operating it in the forward direction.

FIG. 2A is a diagram of a programmed MOSFET which can be used as a write once read only memory cell according to the teachings of the present invention. As shown in FIG. 2A the write once read only memory cell 201 includes a MOSFET in a substrate 200 which has a first source/drain region 202, a second source/drain region 204, and a channel region 206 between the first and second source/drain regions, 202 and 204. In one embodiment, the first source/drain region 202 includes a source region 202 for the MOSFET and the second source/drain region 204 includes a drain region 204 for the MOSFET. FIG. 2A further illustrates a gate 208 separated from the channel region 206 by a gate oxide 210. A first transmission line 212 is coupled to the first source/drain region 202 and a second transmission line 214 is coupled to the second source/drain region 204. In one embodiment, the first transmission line includes a sourceline 212 and the second transmission line includes a bit line 214.

As stated above, write once read only memory cell 201 is comprised of a programmed MOSFET. This programmed MOSFET has a charge 217 trapped in the gate oxide 210 adjacent to the first source/drain region 202 such that the channel region 206 has a first voltage threshold region (Vt1) and a second voltage threshold region (Vt2) in the channel 206. In one embodiment, the charge 217 trapped in the gate oxide 210 adjacent to the first source/drain region 202 includes a trapped electron charge 217.

FIG. 2A illustrates the Vt2 in the channel 206 is adjacent the first source/drain region 202 and that the Vt1 in the channel 206 is adjacent the second source/drain region 204. According to the teachings of the present invention, Vt2 has a higher voltage threshold than Vt1 due to the charge 217 trapped in the gate oxide 217 adjacent to the first source/drain region 202.

FIG. 2B is a diagram suitable for explaining the method by which the MOSFET of the write once read only memory cell 201 of the present invention can be programmed to achieve the embodiments of the present invention. As shown in FIG. 2B the method includes programming the MOSFET in a reverse direction. Programming the MOSFET in the reverse direction includes applying a first voltage potential V1 to a drain region 204 of the MOSFET. In one embodiment, applying a first voltage potential V1 to the drain region 204 of the MOSFET includes grounding the drain region 204 of the MOSFET as shown in FIG. 2B. A second voltage potential V2 is applied to a source region 202 of the MOSFET. In one embodiment, applying a second voltage potential V2 to the source region 202 includes applying a high positive voltage potential (VDD) to the source region 202 of the MOSFET, as shown in FIG. 2B. A gate potential VGS is applied to a gate 208 of the MOSFET. In one embodiment, the gate potential VGS includes a voltage potential which is less than the second voltage potential V2, but which is sufficient to establish conduction in the channel 206 of the MOSFET between the drain region 204 and the source region 202. As shown in FIG. 2B, applying the first, second and gate potentials (V1, V2, and VGS respectively) to the MOSFET creates a hot electron injection into a gate oxide 210 of the MOSFET adjacent to the source region 202. In other words, applying the first, second and gate potentials (V1, V2, and VGS respectively) provides enough energy to the charge carriers, e.g. electrons, being conducted across the channel 206 that, once the charge carriers are near the source region 202, a number of the charge carriers get excited into the gate oxide 210 adjacent to the source region 202. Here the charge carriers become trapped.

In one embodiment of the present invention, the method is continued by subsequently operating the MOSFET in the forward direction in its programmed state during a read operation. Accordingly, the read operation includes grounding the source region 202 and precharging the drain region a fractional voltage of VDD. If the device is addressed by a wordline coupled to the gate, then its conductivity will be determined by the presence or absence of stored charge in the gate insulator. That is, a gate potential can be applied to the gate 208 by a wordline 216 in an effort to form a conduction channel between the source and the drain regions as done with addressing and reading conventional DRAM cells.

However, now in its programmed state, the conduction channel 206 of the MOSFET will have a first voltage threshold region (Vt1) adjacent to the drain region 204 and a second voltage threshold region (Vt2) adjacent to the source region 202, as explained and described in detail in connection with FIG. 2A. According to the teachings of the present invention, the Vt2 has a greater voltage threshold than the Vt1 due to the hot electron injection 217 into a gate oxide 210 of the MOSFET adjacent to the source region 202.

FIG. 2C is a graph plotting a current signal (Ids) detected at the second source/drain region 204 versus a voltage potential, or drain voltage, (VDS) set up between the second source/drain region 204 and the first source/drain region 202 (Ids vs. VDS). In one embodiment, VDS represents the voltage potential set up between the drain region 204 and the source region 202. In FIG. 2C, the curve plotted as 205 represents the conduction behavior of a conventional MOSFET where the MOSFET is not programmed (is normal or not stressed) according to the teachings of the present invention. The curve 207 represents the conduction behavior of the programmed MOSFET (stressed), described above in connection with FIG. 2A, according to the teachings of the present invention. As shown in FIG. 2C, for a particular drain voltage, VDS, the current signal (IDS2) detected at the second source/drain region 204 for the programmed MOSFET (curve 207) is significantly lower than the current signal (IDS1) detected at the second source/drain region 204 for the conventional MOSFET (curve 205) which is not programmed according to the teachings of the present invention. Again, this is attributed to the fact that the channel 206 in the programmed MOSFET of the present invention has two voltage threshold regions and that the voltage threshold, Vt2, near the first source/drain region 202 has a higher voltage threshold than Vt1 near the second source/drain region due to the charge 217 trapped in the gate oxide 217 adjacent to the first source/drain region 202.

Some of these effects have recently been described for use in a different device structure, called an NROM, for flash memories. This latter work in Israel and Germany is based on employing charge trapping in a silicon nitride layer in a non-conventional flash memory device structure. Charge trapping in silicon nitride gate insulators was the basic mechanism used in MNOS memory devices, charge trapping in aluminum oxide gates was the mechanism used in MIOS memory devices, and the present inventor, along with another, disclosed charge trapping at isolated point defects in gate insulators in U.S. Pat. No. 6,140,181 entitled, "Memory Using Insulator Traps."

In contrast to the above work, the present invention discloses programming a MOSFET in a reverse direction to trap charge near the source region and reading the device in a forward direction to form a write once memory based on a modification of DRAM technology.

Prior art DRAM technology generally employs silicon oxide as the gate insulator. Further the emphasis in conventional DRAM devices is placed on trying to minimize charge trapping in the silicon oxide gate insulator. According to the teachings of the present invention, a variety of insulators are used to trap electrons more efficiently than in silicon oxide. That is, in the present invention, the write-once-read-only-memory (WOROM) employs charge trapping in gate insulators such as, wet silicon oxide, silicon nitride, silicon oxynitride SON, silicon rich oxide SRO, aluminum oxide $Al_2O_3$, composite layers of these insulators such as oxide and then silicon nitride, or oxide and then aluminum oxide, or multiple layers as oxide-nitride-oxide. While the charge trapping efficiency of silicon oxide may be low such is not the case for silicon nitride or composite layers of silicon oxide and nitride.

Figure 3:
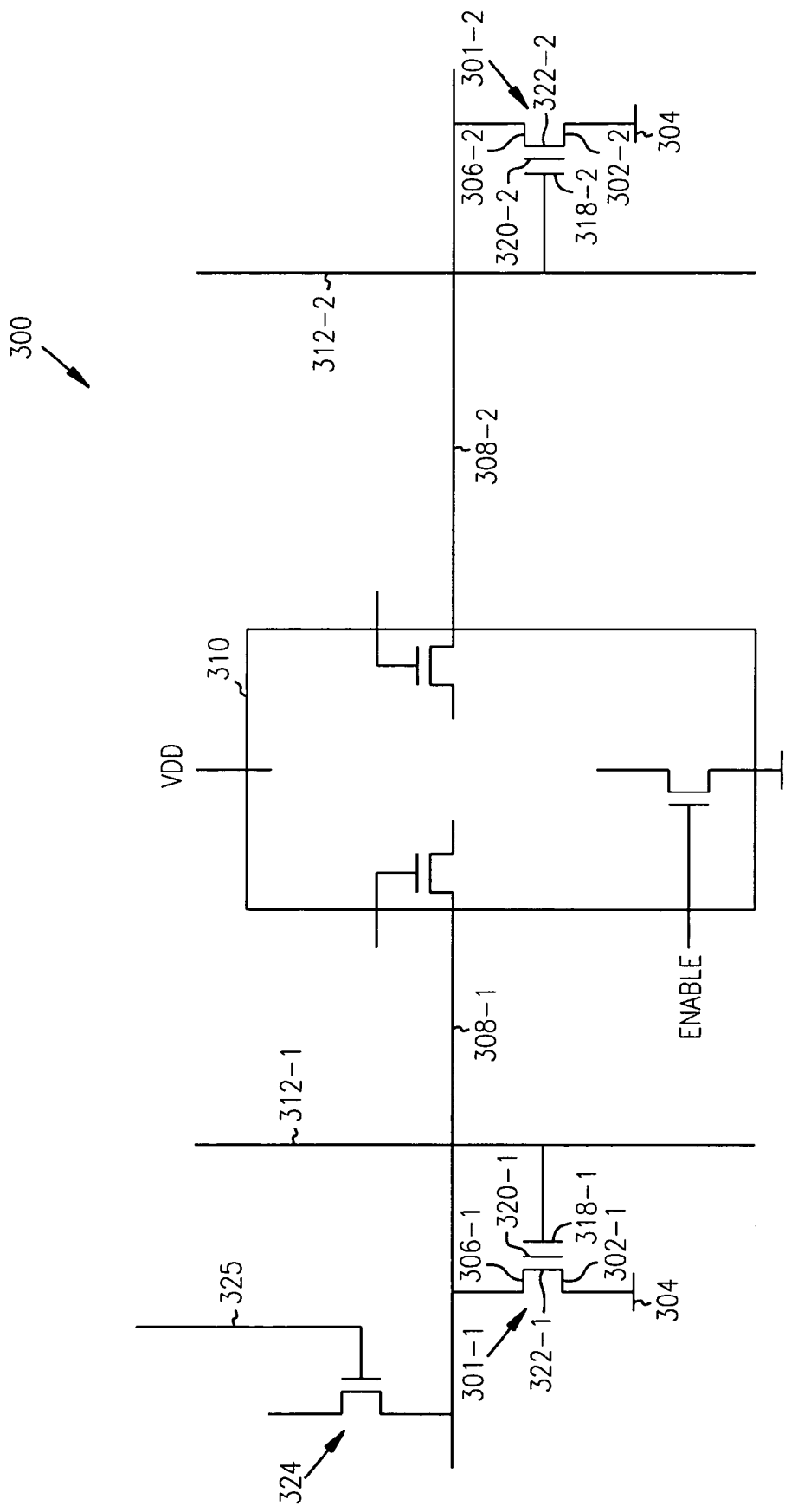
FIG. 3 illustrates a portion of a memory array according to the teachings of the present invention.

FIG. 3 illustrates a portion of a memory array 300 according to the teachings of the present invention. The memory in FIG. 3, is shown illustrating a pair of write once read only memory cells 301-1 and 301-2 formed according to the teachings of the present invention. As one of ordinary skill in the art will understand upon reading this disclosure, any number of write once and read only memory cells can be organized in an array, but for ease of illustration only two are displayed in FIG. 3. As shown in FIG. 3, a first source/drain region, 302-1 and 302-2 respectively, is coupled to an array plate 304. A second source/drain region, 306-1 and 306-2 respectively, is coupled to a bitline, 308-1 and 308-2 respectively. Each of the bitlines, 308-1 and 308-2, couple to a sense amplifier, shown generally at 310. A wordline, 312-1 and 312-2 respectively, is couple to a gate, 314-1 and 314-2 respectively, for each of the write once read only memory cells, 301-1 and 301-2. Finally, a write data/precharge circuit is shown at 324 for coupling a first or a second potential to bitline 308-1. The illustrated write data/precharge circuit 324 is connected to a write data/precharge control line 325. As one of ordinary skill in the art will understand upon reading this disclosure, the write data/precharge circuit 324 is adapted to couple either a ground to the bitline 308-1 during a write operation in the reverse direction, or alternatively to precharge the bitline 308-1 to fractional voltage of VDD during a read operation in the forward direction. As one of ordinary skill in the art will understand upon reading this disclosure, the array plate 304 can be biased to a voltage higher than VDD during a write operation in the reverse direction, or alternatively grounded during a read operation in the forward direction.

As shown in FIG. 3, the array structure 300, including write once read only memory cells 301-1 and 301-2, has no capacitors. Instead, according to the teachings of the present invention, the first source/drain region or source region, 302-1 and 302-2, are coupled via a conductive plug directly to the array plate 304. In order to write, the array plate 304 is biased to voltage higher than VDD and the devices stressed in the reverse direction by grounding the data or bit line, 308-1 or 308-2. If the write once read only memory cell, 301-1 or 301-2, is selected by a word line address, 312-1 or 312-2, then the write once read only memory cell, 301-1 or 301-2, will conduct and be stressed with accompanying hot electron injection into the cells gate insulator adjacent to the source region, 302-1 or 302-2. During read the write once read only memory cell, 301-1 or 301-2, are operated in the forward direction with the array plate 304 grounded and the bit line, 308-1 or 308-2, and respective second source/drain region or drain region, 306-1 and 306-2, of the cells precharged to some fractional voltage of Vdd. If the device is addressed by the word line, 312-1 or 312-2, then its conductivity will be determined by the presence or absence of stored charge and so detected using the DRAM sense amplifier 310. The operation of DRAM sense amplifiers is described, for example, in U.S. Pat. Nos. 5,627,785; 5,280,205; and 5,042,011, all assigned to Micron Technology Inc., and incorporated by reference herein. The array would thus be addressed and read in the conventional manner used in DRAM's, but programmed as write once read only memory cells in a novel fashion.

In operation the devices would be subjected to hot electron stress in the reverse direction by biasing the array plate 304, and read while grounding the array plate 304 to compare a stressed write once read only memory cell, e.g. cell 301-1, to an unstressed dummy device/cell, e.g. 301-2, as shown in FIG. 3. The write and possible erase feature could be used during manufacture and test to initially program all cells or devices to have similar or matching conductivity before use in the field. The sense amplifier 310 can then detect small differences in cell or device characteristics due to stress induced changes in device characteristics during the write operation.

As one of ordinary skill in the art will understand upon reading this disclosure such arrays of write once read only memory cells are conveniently realized by a modification of DRAM technology. According to the teachings of the present invention a gate insulator of the write once read only memory cell includes gate insulators selected from the group of thicker layers of $SiO_2$ formed by wet oxidation, SON silicon oxynitride, SRO silicon rich oxide, $Al_2O_3$ aluminum oxide, composite layers and implanted oxides with traps (L. Forbes and J. Geusic, "Memory using insulator traps," U.S. Pat. No. 6,140,181). Conventional transistors for address decode and sense amplifiers can be fabricated after this step with normal thin gate insulators of silicon oxide.

Figure 4A:
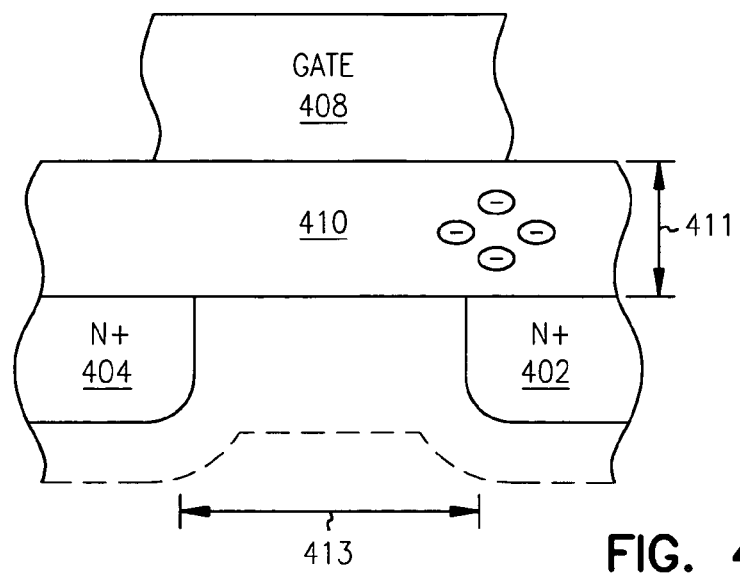
FIGS. 4A–4B illustrates the operation of the novel write once read only memory cell formed according to the teachings of the present invention.
Figure 4B:
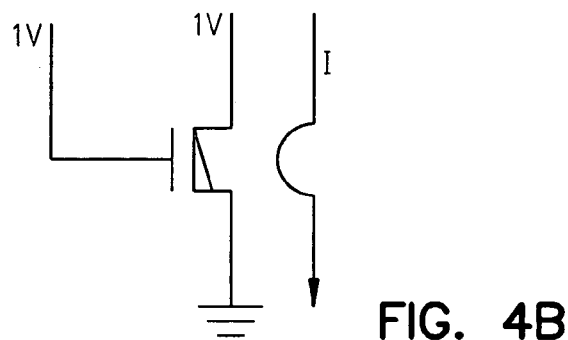
Figure 5:
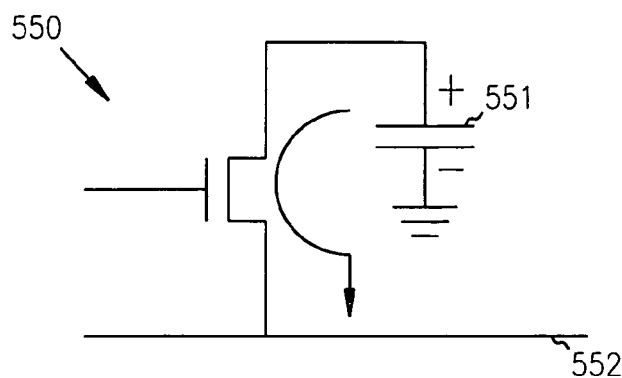
FIG. 5 illustrates the operation of a conventional DRAM cell.

FIGS. 4A–B and 5 are useful in illustrating the use of charge storage in the gate insulator to modulate the conductivity of the write once read only memory cell according to the teachings of the present invention. That is, FIGS. 4A–4B illustrates the operation of the novel write once read only memory cell 401 formed according to the teachings of the present invention. And, FIG. 5 illustrates the operation of a conventional DRAM cell 501. As shown in FIG. 4A, the gate insulator 410 is made thicker than in a conventional DRAM cell. For example, an embodiment of the gate insulator 410 has a thickness 411 equal to or greater than 10 nm or 100 Å ($10^{-6}$ cm). In the embodiment shown in FIG. 4A a write once read only memory cell has dimensions 413 of 0.1 μm ($10^{-5}$ cm) by 0.1 μm. The capacitance, Ci, of the structure depends on the dielectric constant, $\in_i$, and the thickness of the insulating layers, t. In an embodiment, the dielectric constant is $0.3 \times 10^{-12}$ F/cm and the thickness of the insulating layer is $10^{-6}$ cm such that $Ci=\in i/t$, Farads/cm² or $3\times10^{-7}$ F/cm². In one embodiment, a charge of $10^{12}$ electrons/cm² is programmed into the gate insulator of the write once read only memory cell. This produces a stored charge $\Delta Q=10^{12}$ electrons/cm²$\times 1.6\times10^{-19}$ Coulombs. In this embodiment, the resulting change in the threshold voltage ($\Delta Vt$) of the write once read only memory cell will be approximately 0.5 Volts ($\Delta Vt=\Delta Q/Ci$ or $1.6\times10^{-7}/3\times10^{-7}=\frac{1}{2}$ Volt). In effect, the programmed write once read only memory cell, or modified MOSFET is a programmed MOSFET having a charge trapped in the gate insulator adjacent to a first source/drain region, or source region, such that the channel region has a first voltage threshold region (Vt1) and a second voltage threshold region (Vt2), where Vt2 is greater than Vt1, and Vt2 is adjacent the source region such that the programmed MOSFET operates at reduced drain source current. For $\Delta Q=10^{12}$ electrons/cm³ in an area of $10^{-10}$ cm², this embodiment of the present invention involves trapping a charge of approximately 100 electrons in the gate insulator of the write once read only memory cell. In this embodiment, an original $V_T$ is approximately ½ Volt and the $V_T$ with charge trapping is approximately 1 Volt.

FIG. 4B aids to further illustrate the conduction behavior of the novel write once read only memory cell of the present invention. As one of ordinary skill in the art will understand upon reading this disclosure, if the write once read only memory cell is being driven with a gate voltage of 1.0 Volt (V) and the nominal threshold voltage without the gate insulator charged is ½ V, then if the gate insulator is charged the transistor of the present invention will be off and not conduct. That is, by trapping a charge of approximately 100 electrons in the gate insulator of the write once read only memory cell, having dimensions of 0.1 μm ($10^{-5}$ cm) by 0.1 μm, will raise the threshold voltage of the write once read only memory cell to 1.0 Volt and a 1.0 Volt gate potential will not be sufficient to turn the device on, e.g. Vt=1.0 V, I =0.

Conversely, if the nominal threshold voltage without the gate insulator charged is ½ V, then $I=\mu C_{ox} \times (W/L) \times ((Vgs-Vt)^2/2)$, or 12.5 μA, with $\mu C_{ox}=\mu C_i=100$ μA/V² and W/L=1. That is, the write once read only memory cell of the present invention, having the dimensions describe above will produce a current $I=100$ μA/V²$\times(\frac{1}{4})\times(\frac{1}{2})=12.5$ μA. Thus, in the present invention an un-written, or un-programmed write once read only memory cell can conduct a current of the order 12.5 μA, whereas if the gate insulator is charged then the write once read only memory cell will not conduct. As one of ordinary skill in the art will understand upon reading this disclosure, the sense amplifiers used in DRAM arrays, and as describe above, can easily detect such differences in current on the bit lines.

By way of comparison, in a conventional DRAM cell 550 with 30 femtoFarad (fF) storage capacitor 551 charged to 50 femto Coulombs (fC), if these are read over 5 nS then the average current on a bit line 552 is only 10 μA (I=50fc/5ns=10 μA). Thus, storing a 50 fC charge on the storage capacitor shown in FIG. 5 equates to storing 300,000 electrons ($Q=50fC/(1.6\times10^{-19})=30\times10^4=300,000$ elctrons).

According to the teachings of the present invention, the transistors in the array are utilized not just as passive on or off switches as transfer devices in DRAM arrays but rather as active devices providing gain. In the present invention, to program the transistor "off," requires only a stored charge in the gate insulator is only about 100 electrons if the area is 0.1 μm by 0.1 μm. And, if the write once read only memory cell is un-programmed, e.g. no stored charge trapped in the gate insulator, and if the transistor is addressed over 10 nS a of current of 12.5 μA is provided. The integrated drain current then has a charge of 125 fC or 800,000 electrons. This is in comparison to the charge on a DRAM capacitor of 50 fc which is only about 300,000 electrons. Hence, the use of the transistors in the array as active devices with gain, rather than just switches, provides an amplification of the stored charge, in the gate insulator, from 100 to 800,000 electrons over a read address period of 10 nS.

The retention of the memory devices depends on mobility degradation, which is for all intensive purposes probably permanent and trapped charge which won't decay with zero or positive gate bias. There are some design considerations involved in that the easier programming with SON and/or SRO insulators will result in shorter retention times.

Figure 6:
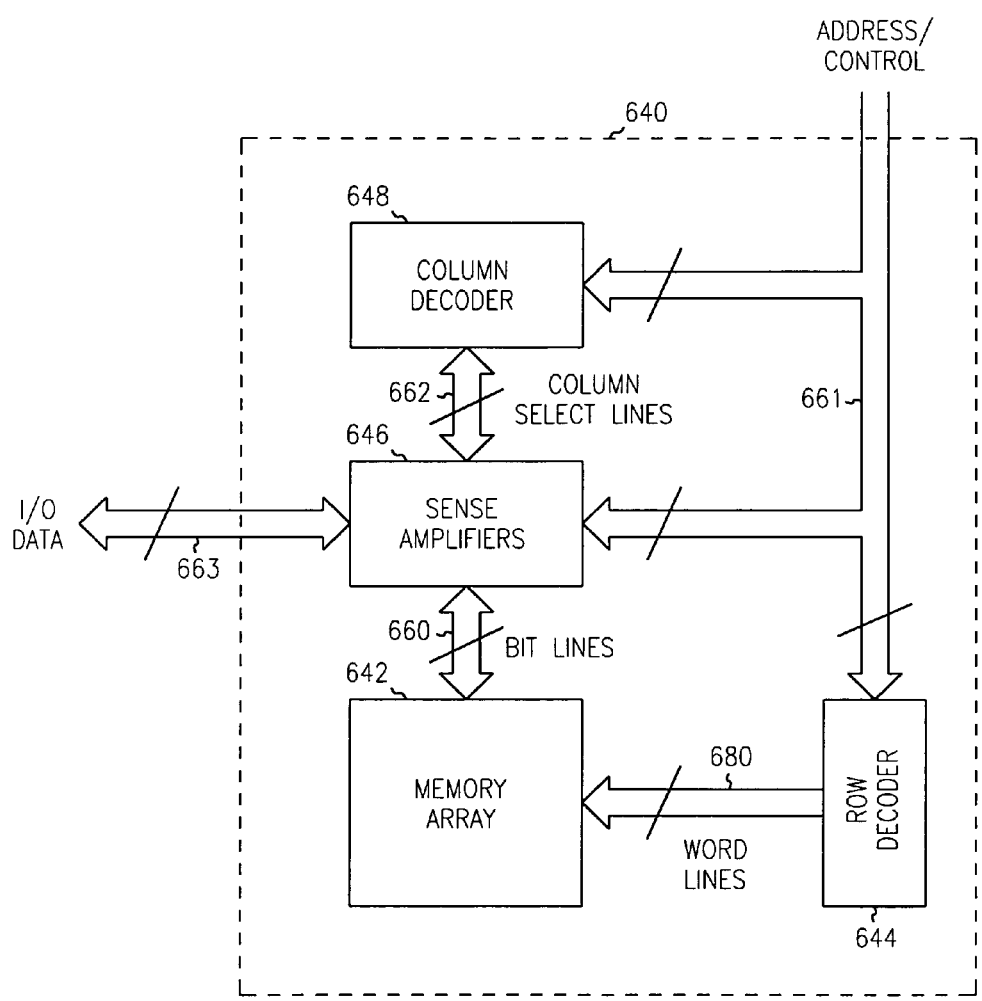
FIG. 6 illustrates a memory device according to the teachings of the present invention.

In FIG. 6 a memory device is illustrated according to the teachings of the present invention. The memory device 640 contains a memory array 642, row and column decoders 644, 648 and a sense amplifier circuit 646. The memory array 642 consists of a plurality of write once read only memory cells 600, formed according to the teachings of the present invention whose word lines 680 and bit lines 660 are commonly arranged into rows and columns, respectively. The bit lines 660 of the memory array 642 are connected to the sense amplifier circuit 646, while its word lines 680 are connected to the row decoder 644. Address and control signals are input on address/control lines 661 into the memory device 640 and connected to the column decoder 648, sense amplifier circuit 646 and row decoder 644 and are used to gain read and write access, among other things, to the memory array 642.

The column decoder 648 is connected to the sense amplifier circuit 646 via control and column select signals on column select lines 662. The sense amplifier circuit 646 receives input data destined for the memory array 642 and outputs data read from the memory array 642 over input/output (I/O) data lines 663. Data is read from the cells of the memory array 642 by activating a word line 680 (via the row decoder 644), which couples all of the memory cells corresponding to that word line to respective bit lines 660, which define the columns of the array. One or more bit lines 660 are also activated. When a particular word line 680 and bit lines 660 are activated, the sense amplifier circuit 646 connected to a bit line column detects and amplifies the conduction sensed through a given write once read only memory cell, where in the read operation the source region of a given cell is couple to a grounded array plate (not shown), and transfered its bit line 660 by measuring the potential difference between the activated bit line 660 and a reference line which may be an inactive bit line. The operation of Memory device sense amplifiers is described, for example, in U.S. Pat. Nos. 5,627,785; 5,280,205; and 5,042,011, all assigned to Micron Technology Inc., and incorporated by reference herein.

Figure 7:
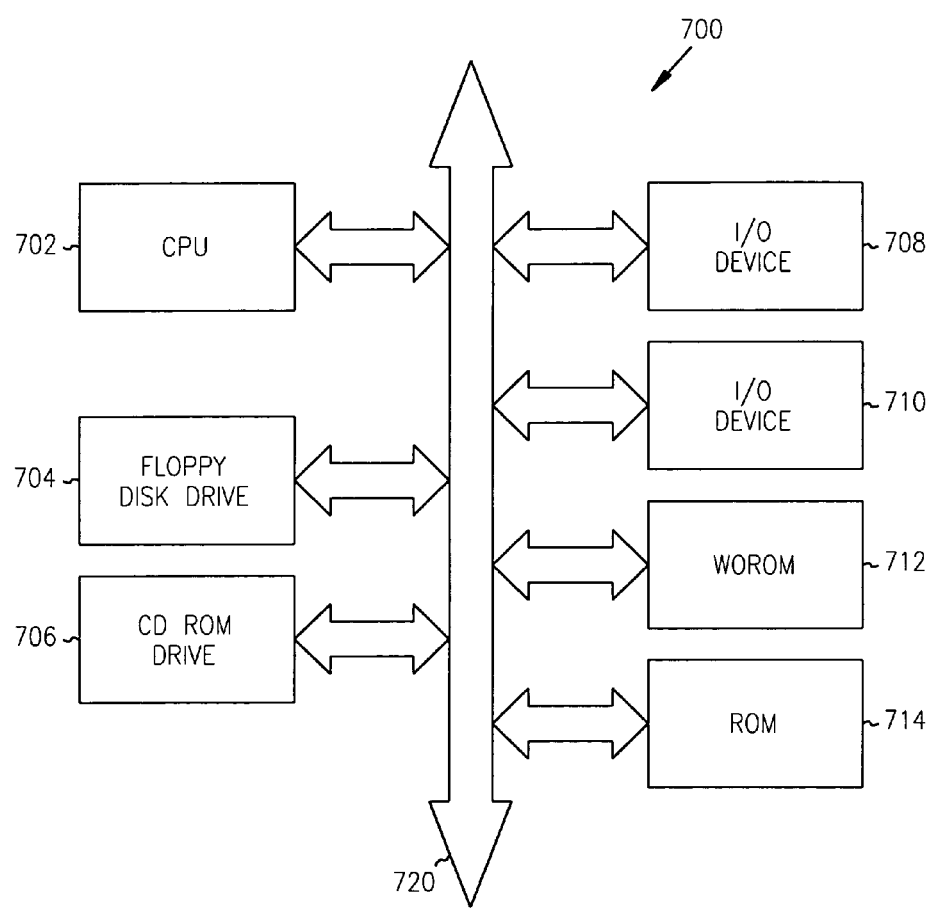
FIG. 7 is a block diagram of an electrical system, or processor-based system, utilizing write once read only memory constructed in accordance with the present invention.

FIG. 7 is a block diagram of an electrical system, or processor-based system, 700 utilizing write once read only memory 712 constructed in accordance with the present invention. That is, the write once read only memory (WOROM) 712 utilizes the modified DRAM cell as explained and described in detail in connection with FIGS. 2–4. The processor-based system 700 may be a computer system, a process control system or any other system employing a processor and associated memory. The system 700 includes a central processing unit (CPU) 702, e.g., a microprocessor, that communicates with the write once read only memory 712 and an I/O device 708 over a bus 720. It must be noted that the bus 720 may be a series of buses and bridges commonly used in a processor-based system, but for convenience purposes only, the bus 720 has been illustrated as a single bus. A second I/O device 710 is illustrated, but is not necessary to practice the invention. The processor-based system 700 can also includes read-only memory (ROM) 714 and may include peripheral devices such as a floppy disk drive 704 and a compact disk (CD) ROM drive 706 that also communicates with the CPU 702 over the bus 720 as is well known in the art.

It will be appreciated by those skilled in the art that additional circuitry and control signals can be provided, and that the memory device 700 has been simplified to help focus on the invention. At least one of the write once read only memory cell in WOROM 712 includes a programmed MOSFET having a charge trapped in the gate insulator adjacent to a first source/drain region, or source region, such that the channel region has a first voltage threshold region (Vt1) and a second voltage threshold region (Vt2), where Vt2 is greater than Vt1, and Vt2 is adjacent the source region such that the programmed MOSFET operates at reduced drain source current.

It will be understood that the embodiment shown in FIG. 7 illustrates an embodiment for electronic system circuitry in which the novel memory cells of the present invention are used. The illustration of system 700, as shown in FIG. 7, is intended to provide a general understanding of one application for the structure and circuitry of the present invention, and is not intended to serve as a complete description of all the elements and features of an electronic system using the novel memory cell structures. Further, the invention is equally applicable to any size and type of memory device 700 using the novel memory cells of the present invention and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the novel memory cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

CONCLUSION

Utilization of a modification of well established DRAM technology and arrays will serve to afford an inexpensive memory device which can be regarded as disposable if the information is later transferred to another medium, for instance CDROM's. The high density of DRAM array structures will afford the storage of a large volume of digital data or images at a very low cost per bit. There are many applications where the data need only be written once, the low cost of these memories will make it more efficient to just utilize a new memory array, and dispose of the old memory array, rather than trying to erase and reuse these arrays as is done with current flash memories.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method for forming a write once read only memory cell, comprising:
    forming a metal oxide semiconductor field effect transistor (MOSFET); wherein forming the MOSFET includes:
        forming a first source/drain region, a second source/drain region, and a channel region between the first and the second source/drain regions in a substrate;
        forming a gate insulator above the channel region; and
        forming a gate above the gate insulator;
    forming an array plate;
    forming a conductive plug coupling the first source/drain region to the array plate;
    forming a bitline coupled to the second source/drain region such that the write once read only memory cell can be programmed in a reverse direction to have a trapped charge in the gate insulator adjacent to the first source/drain region by biasing the array plate to a voltage higher than VDD, grounding the bitline, and selecting the gate by a wordline address, and wherein the programmed MOSFET will operate at reduced drain source current in a forward direction.

2. The method of claim 1, wherein forming a gate insulator above the channel region includes forming a gate insulator having a thickness of at least 10 nanometers (nm).

3. The method of claim 2, wherein forming a gate insulator above the channel region includes forming a gate insulator selected from the group of silicon dioxide formed by wet oxidation, silicon oxynitride, silicon rich oxide, and aluminum oxide.

4. The method of claim 1, wherein forming a gate insulator above the channel region includes forming a composite gate layer.

5. The method of claim 4, wherein forming a composite gate layer includes forming a composite gate layer having a silicon dioxide layer and a silicon nitride layer.

6. The method of claim 4, wherein forming a composite gate layer includes forming a composite gate layer having a silicon dioxide and an aluminum oxide layer.

7. The method of claim 1, wherein forming a gate insulator above the channel region includes forming a multiple layer of oxide-nitride-oxide.

8. The method of claim 1, wherein forming a gate insulator above the channel region includes forming the gate insulator with implanted oxides having traps.

9. A method for forming a memory device, comprising:
forming a transistor, including:
forming a first source/drain region, a second source/drain region, and a channel region between the first and the second source/drain regions in a substrate;
forming a gate insulator above the channel region;
forming a gate above the gate insulator;
forming an array plate;
forming a conductive plug coupling the first source/drain region to the array plate;
forming a bitline coupled to the second source/drain region; and
configuring a circuit in the memory device to program the memory cell in a reverse direction with a trapped charge in the gate insulator adjacent to the first source/drain region.

10. The method of claim 9, wherein, configuring the circuit in the memory device includes biasing the array plate to a voltage higher than VDD, grounding the bitline, and selecting the gate by a wordline address, and wherein the transistor will operate at reduced drain source current in a forward direction.

11. The method of claim 9, wherein forming a gate insulator above the channel region includes forming a gate insulator selected from the group of silicon oxide, silicon oxynitride, silicon rich oxide, and aluminum oxide.

12. The method of claim 9, wherein forming a gate insulator above the channel region includes forming a composite gate insulator including:
a layer of silicon dioxide; and
a layer of silicon nitride.

13. The method of claim 9, wherein forming a gate insulator above the channel region includes forming a composite gate insulator including:
a layer of silicon dioxide; and
a layer of aluminum oxide.

14. The method of claim 9, wherein forming a gate insulator above the channel region includes forming an oxide-nitride-oxide layer structure.

15. The method of claim 9, wherein forming a gate insulator above the channel region includes implanting an impurity element into a gate insulator material.

16. A method for forming a memory device, comprising:
forming a transistor, including:
forming a first source/drain region, a second source/drain region, and a channel region between the first and the second source/drain regions in a substrate;
forming a composite gate insulator above the channel region including a layer of silicon dioxide and a layer of silicon nitride;
forming a gate above the composite gate insulator;
forming an array plate;
forming a conductive plug coupling the first source/drain region to the array plate;
forming a bitline coupled to the second source/drain region; and
configuring a circuit in the memory device to program the memory cell in a reverse direction with a trapped charge in the gate insulator adjacent to the first source/drain region.

17. The method of claim 16, wherein forming a composite gate insulator includes forming to a thickness of at least 10 nanometers (nm).

18. The method of claim 16, wherein, configuring the circuit in the memory device includes biasing the array plate to a voltage higher than VDD, grounding the bitline, and selecting the gate by a wordline address, and wherein the transistor will operate at reduced drain source current in a forward direction.

19. A method for forming a memory device, comprising:
forming a transistor, including:
forming a first source/drain region, a second source/drain region, and a channel region between the first and the second source/drain regions in a substrate;
forming a composite gate insulator above the channel region including a layer of silicon dioxide and a layer of aluminum oxide;
forming a gate above the composite gate insulator;
forming an array plate;
forming a conductive plug coupling the first source/drain region to the array plate;
forming a bitline coupled to the second source/drain region; and
configuring a circuit in the memory device to program the memory cell in a reverse direction with a trapped charge in the gate insulator adjacent to the first source/drain region.

20. The method of claim 19, wherein forming a composite gate insulator includes forming to a thickness of at least 10 nanometers (nm).

21. The method of claim 19, wherein, configuring the circuit in the memory device includes biasing the array plate to a voltage higher than VDD, grounding the bitline, and selecting the gate by a wordline address, and wherein the transistor will operate at reduced drain source current in a forward direction.

22. A method for forming a memory device, comprising:
forming a transistor, including:
forming a first source/drain region, a second source/drain region, and a channel region between the first and the second source/drain regions in a substrate;
forming a composite gate insulator above the channel region including an oxide-nitride-oxide layer structure;
forming a gate above the composite gate insulator;
forming an array plate;
forming a conductive plug coupling the first source/drain region to the array plate;
forming a bitline coupled to the second source/drain region; and
configuring a circuit in the memory device to program the memory cell in a reverse direction with a trapped charge in the gate insulator adjacent to the first source/drain region.

23. The method of claim 22, wherein forming a composite gate insulator includes forming to a thickness of at least 10 nanometers (nm).

24. The method of claim 22, wherein, configuring the circuit in the memory device includes biasing the array plate to a voltage higher than VDD, grounding the bitline, and selecting the gate by a wordline address, and wherein the transistor will operate at reduced drain source current in a forward direction.

25. A method for forming a memory device, comprising:
forming a transistor, including:
forming a first source/drain region, a second source/drain region, and a channel region between the first and the second source/drain regions in a substrate;
implanting an impurity element into an insulator material to form a gate insulator above the channel region;

forming a gate above the gate insulator;
forming an array plate;
forming a conductive plug coupling the first source/drain region to the array plate;
forming a bitline coupled to the second source/drain region; and configuring a circuit in the memory device to program the memory cell in a reverse direction with a trapped charge in the gate insulator adjacent to the first source/drain region.

26. The method of claim 25, wherein forming a composite gate insulator includes forming to a thickness of at least 10 nanometers (nm).

27. The method of claim 25, wherein, configuring the circuit in the memory device includes biasing the array plate to a voltage higher than VDD, grounding the bitline, and selecting the gate by a wordline address, and wherein the transistor will operate at reduced drain source current in a forward direction.

28. A method for forming an electronic system, comprising:
forming a processor;
forming a memory device, including:
forming a transistor in a memory cell; including
forming a first source/drain region, a second source/drain region, and a channel region between the first and the second source/drain regions in a substrate;
forming a gate insulator above the channel region;
forming a gate above the gate insulator;
forming an array plate;
forming a conductive plug coupling the first source/drain region to the array plate;
forming a bitline coupled to the second source/drain region; and
configuring a circuit in the memory device to program the memory cell in a reverse direction with a trapped charge in the gate insulator adjacent to the first source/drain region; and
coupling the processor to the memory device.

29. The method of claim 28, wherein forming the memory device includes forming a write once read only memory device.

30. The method of claim 28, wherein forming the gate insulator above the channel region includes forming a composite gate insulator above the channel region.

* * * * *

UNITED STATES PATENT AND TRADEMARK OFFICE
CERTIFICATE OF CORRECTION

PATENT NO.      : 7,112,494 B2
APPLICATION NO. : 10/930514
DATED           : September 26, 2006
INVENTOR(S)     : Forbes It is certified that error appears in the above-identified patent and that said Letters Patent is hereby corrected as shown below:

On the face page, in field (73), in "Assignee", in column 1, line 1, after "ID" insert -- 83716 --.

On the face page, in field (56), under "Foreign Patent Documents", column 2, line 1, after "10/1991" insert -- H01L 29/784 --.

On the face page, in field (56), under "Other Publications", in column 2, line 2, delete "doposition" and insert -- deposition --, therefor.

On page 2, in field (56), under "Foreign Patent Documents", in column 2, line 2, after "8/1994" insert -- H01L 29/784 --.

On page 2, in field (56), under "Foreign Patent Documents", in column 2, line 3, after "10/1994" insert -- H01L 29/788 --.

On page 3, in field (56), under "Foreign Patent Documents", in column 1, line 1, after "10/1996" insert -- H01L 27/10 --.

On page 3, in field (56), under "Other Publications", in column 1, line 18, after "as" insert -- a --.

On page 3, in field (56), under "Other Publications", in column 1, line 58, delete "WF6 and Si2H6" and insert -- $WF_6$ and $Si_2H_6$ --, therefor.

On page 3, in field (56), under "Other Publications", in column 1, line 63, delete "Mecrocrystalline" and insert -- Microcrystalline --, therefor.

On page 3, in field (56), under "Other Publications", in column 2, line 9, delete "HfO2" and insert -- $HfO_2$ --, therefor.

On page 3, in field (56), under "Other Publications", in column 2, line 34, delete "HfO2-Ta2O3" and insert -- $HfO_2$-$Ta_2O_3$ --, therefor.

UNITED STATES PATENT AND TRADEMARK OFFICE
CERTIFICATE OF CORRECTION

PATENT NO. : 7,112,494 B2
APPLICATION NO. : 10/930514
DATED : September 26, 2006
INVENTOR(S) : Forbes It is certified that error appears in the above-identified patent and that said Letters Patent is hereby corrected as shown below:

On page 3, in field (56), under "Other Publications", in column 2, line 42, delete "Ta2O5" and insert -- $Ta_2O_5$ --, therefor.

On page 4, in field (56), under "Other Publications", in column 1, line 9, delete "TiO2" and insert -- $TiO_2$ --, therefor.

On page 4, in field (56), under "Other Publications", in column 1, line 13, Delete "Charcteristics" and insert -- Characteristics --, therefor.

On page 4, in field (56), under "Other Publications", in column 2, line 6, Delete "(Aug. 200)" and insert -- (Aug. 2000) --, therefor.

On page 4, in field (56), under "Other Publications", in column 2, line 16, delete "Programmme" and insert -- Programme --, therefor.

In column 1, line 16, insert -- filed June 21, 2002 -- before "Ser.".

In column 1, line 18, insert -- filed June 21, 2002 -- before "Ser.".

In column 1, line 19, insert -- filed June 21, 2002-- before "Ser.".

In column 1, line 19, after "10/177,214," insert -- now Patent 6,888,739 --.

In column 1, line 21, insert -- filed June 21, 2002 -- before "Ser.".

In column 1, line 22, insert -- filed June 21, 2002 -- before "Ser.".

In column 1, line 23, after "10/177,208," insert -- now Patent 6,853,587 --.

In column 1, line 24, insert -- filed June 21, 2002 -- before "Ser.".

UNITED STATES PATENT AND TRADEMARK OFFICE
CERTIFICATE OF CORRECTION

PATENT NO. : 7,112,494 B2
APPLICATION NO. : 10/930514
DATED : September 26, 2006
INVENTOR(S) : Forbes It is certified that error appears in the above-identified patent and that said Letters Patent is hereby corrected as shown below:

In column 10, line 10, delete "elctrons" and insert -- electrons --, therefor.

In column 10, line 22, delete "50 fc" and insert -- 50 fC --, therefor.

Signed and Sealed this

Ninth Day of January, 2007

JON W. DUDAS
*Director of the United States Patent and Trademark Office*